United States Patent
Chung et al.

(10) Patent No.: US 9,076,746 B2
(45) Date of Patent: Jul. 7, 2015

(54) ORGANIC LIGHT-EMITTING DISPLAY DEVICE AND METHOD FOR MANUFACTURING THE ORGANIC LIGHT-EMITTING DISPLAY DEVICE

(71) Applicant: Samsung Display Co., Ltd., Yongin, Gyeonggi-Do (KR)

(72) Inventors: Ho-Ryun Chung, Yongin (KR); Jang-Doo Lee, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 13/962,843

(22) Filed: Aug. 8, 2013

(65) Prior Publication Data
US 2014/0346444 A1 Nov. 27, 2014

(30) Foreign Application Priority Data

May 23, 2013 (KR) .................. 10-2013-0058538

(51) Int. Cl.
*H01L 29/08* (2006.01)
*H01L 35/24* (2006.01)
*H01L 51/00* (2006.01)
*H01L 27/32* (2006.01)
*H01L 51/56* (2006.01)

(52) U.S. Cl.
CPC ............ *H01L 27/3276* (2013.01); *H01L 51/56* (2013.01)

(58) Field of Classification Search
CPC .......... H01L 51/00; H01L 27/00; H01L 29/00
USPC ...................................... 257/40, 347
See application file for complete search history.

(56) References Cited

U.S. PATENT DOCUMENTS

| | | | |
|---|---|---|---|
| 8,237,359 B2* | 8/2012 | Higashida et al. | 313/506 |
| 8,415,873 B2* | 4/2013 | Kang et al. | 313/504 |
| 8,514,211 B2* | 8/2013 | Choi et al. | 345/211 |
| 2009/0322718 A1* | 12/2009 | Higashida et al. | 345/205 |
| 2010/0085342 A1* | 4/2010 | Choi et al. | 345/211 |
| 2011/0163664 A1* | 7/2011 | Kang et al. | 313/504 |
| 2012/0228600 A1 | 9/2012 | Boerner | |
| 2013/0313530 A1* | 11/2013 | Seo et al. | 257/40 |

FOREIGN PATENT DOCUMENTS

| | | |
|---|---|---|
| KR | 1020110113089 | 10/2011 |
| KR | 1020120028734 | 3/2012 |
| KR | 10-2012-0098817 | 9/2012 |
| KR | 1020030086821 | 11/2013 |

* cited by examiner

*Primary Examiner* — Telly Green
(74) *Attorney, Agent, or Firm* — Innovation Counsel LLP (57) ABSTRACT

A display device includes a power line configured to transmit an electric current. The display device further includes a plurality of pixel electrode units associated with a single pixel of the display device and configured to share the electric current. The display device further includes a common electrode overlapping the plurality of pixel electrode units. The display device further includes a plurality of light-emitting units associated with the single pixel of the display device and disposed between the common electrode and the plurality of pixel electrode units, wherein each light-emitting unit of the plurality of light-emitting units overlaps a pixel electrode unit of the plurality of pixel electrode units.

14 Claims, 10 Drawing Sheets

ORGANIC LIGHT-EMITTING DISPLAY DEVICE AND METHOD FOR MANUFACTURING THE ORGANIC LIGHT-EMITTING DISPLAY DEVICE

CROSS-REFERENCE TO RELATED PATENT APPLICATION

This application claims the benefit of Korean Patent Application No. 10-2013-0058538, filed on May 23, 2013, in the Korean Intellectual Property Office, the disclosure of which is incorporated herein in its entirety by reference.

BACKGROUND OF THE INVENTION

1. Field of the Invention

The present invention relates to an organic light-emitting display device and a method for manufacturing the organic light-emitting display device.

2. Description of the Related Art

Organic light-emitting display devices are a self-emission display devices that may have fast response speeds, wide viewing angles, and excellent contrast, in comparison with some other types of display devices.

Typically, an organic light-emitting display device includes thin film transistors (TFTs) and organic electroluminescent (EL) elements, which are controlled by the TFTs for displaying images. When electric currents are supplied to the organic EL elements through the TFTs, the organic EL elements may emit light to display an image.

In a sub-pixel of an organic light-emitting display device, malfunction of an organic EL element may be caused by foreign matters in the organic EL element. The malfunction of the organic EL element may result in a dead pixel in the organic light-emitting display device.

SUMMARY OF THE INVENTION

One or more embodiments of present invention may be related to an organic light-emitting display device that may advantageously display images with satisfactory quality even if some pixel electrode units of the organic light-emitting display device malfunction. One or more embodiments of the invention may be related to a method for manufacturing the organic light-emitting display device.

One or more embodiments of the invention may be related to a display device that includes a power line configured to transmit an electric current. The display device may further include a plurality of pixel electrode units associated with a single pixel of the display device and configured to share the electric current. The display device may further include a common electrode overlapping the plurality of pixel electrode units. The display device may further include a plurality of light-emitting units associated with the single pixel of the display device and disposed between the common electrode and the plurality of pixel electrode units, wherein each light-emitting unit of the plurality of light-emitting units overlaps a pixel electrode unit of the plurality of pixel electrode units. Even if some of the plurality of pixel electrode units and/or some of the plurality of light-emitting units may malfunction, the pixel may still provide sufficient light such that the display device may still display images with satisfactory quality.

In one or more embodiments, the display device may include a resistive layer that contacts the plurality of pixel electrode units, is configured to divide the electric current to generate a plurality of divided currents, and is configured to provide a divided current of the plurality of divided currents to each pixel electrode unit of the plurality of pixel electrode units.

In one or more embodiments, the resistive layer may include at least one of amorphous silicon, polysilicon, and an oxide semiconductor.

In one or more embodiments, the display device may include a plurality of metal units that contacts the resistive layer, wherein a portion of the resistive layer is disposed between the plurality of metal units and the plurality of pixel electrode units, and wherein each metal unit of the plurality of metal units overlaps a pixel electrode unit of the plurality of pixel electrode units in a direction perpendicular to surface of the resistive layer.

In one or more embodiments, the display device may include a plurality of metal units that contacts the resistive layer, wherein a portion of the resistive layer is disposed between the plurality of metal units and the plurality of pixel electrode units, and wherein each metal unit of the plurality of metal units does not substantially overlap any pixel electrode unit of the plurality of pixel electrode units in a direction perpendicular to surface of the resistive layer.

In one or more embodiments, the display device may include a plurality of doped silicon units that contacts the resistive layer, wherein a portion of the resistive layer is disposed between the plurality of doped silicon units and the plurality of pixel electrode units, and wherein each doped silicon unit of the plurality of doped silicon units overlaps a pixel electrode unit of the plurality of pixel electrode units in a direction perpendicular to surface of the resistive layer.

In one or more embodiments, the display device may include a plurality of doped silicon units that contacts the resistive layer, wherein a portion of the resistive layer is disposed between the plurality of doped silicon units and the plurality of pixel electrode units, and wherein each doped silicon unit of the plurality of doped silicon units does not substantially overlap any pixel electrode unit of the plurality of pixel electrode units in a direction perpendicular to surface of the resistive layer.

In one or more embodiments, the display device may include the following elements: a substrate overlapping the common electrode, wherein the resistive layer is disposed between the substrate and the common electrode; and a buffer layer disposed between the substrate and the resistive layer.

In one or more embodiments, the display device may include a first current-receiving electrode that is electrically connected to the power line and surrounds the plurality of pixel electrode units.

In one or more embodiments, the display device may include a resistive layer that contacts the first current-receiving electrode for receiving the electric current from the first current-receiving electrode, contacts the plurality of pixel electrode units, is configured to divide the electric current to generate a plurality of divided currents, and is configured to provide a divided current of the plurality of divided currents to each pixel electrode unit of the plurality of pixel electrode units.

In one or more embodiments, the display device may include the following elements: a switching element electrically connected to the power line for receiving the electric current; and a second current-receiving electrode disposed between the first current-receiving electrode and an electrode of the switching element for transmitting the electric current from the switching element to the first current-receiving electrode. The first current-receiving electrode is formed of a first material, and the second current-receiving electrode may be formed of a second material that is different from the first material.

In one or more embodiments, each pixel electrode unit of the plurality of pixel electrode units may have a quadrangular shape in a plan view of the display device.

In one or more embodiments, the display device may include an insulator that overlaps common electrode, electrically insulates the pixel electrode units from each other, and electrically insulates the light-emitting units from each other.

In one or more embodiments, a first portion of the common electrode contacts a light-emitting unit of the plurality of light-emitting units, a second portion of the common electrode contacts the insulator without contacting any light-emitting unit of the plurality of light-emitting units, and a distance between the first portion of the common electrode and the resistive layer is smaller than a distance between the second portion of the common electrode and the resistive layer.

One more embodiments of the invention may be related to a method for manufacturing a display device. The method may include the following steps: providing a substrate; providing a resistive layer that overlaps the substrate; providing a pixel electrode layer on the resistive layer; patterning the pixel electrode layer to produce a plurality of pixel electrode units for a pixel of the display device; forming a plurality of light-emitting units for the pixel of the display device, wherein each light-emitting unit of the plurality of light-emitting units overlaps a pixel electrode units a pixel electrode unit of the plurality of pixel electrode units; and providing a common electrode such that the plurality of light-emitting units is disposed between the common electrode and the plurality of pixel electrode units.

In one or more embodiments, the method may include the following steps: forming a switching element that is electrically connected to the plurality of pixel electrode units that is formed for the pixel; and forming a power line that is electrically connected to the switching element.

In one or more embodiments, the method may include the following steps: before the providing the resistive layer, providing a plurality of metal units; providing the resistive layer such that the a plurality of metal units contacts the resistive layer; and forming the plurality of pixel electrode units such that a portion of the resistive layer is disposed between the plurality of metal units and the plurality of pixel electrode units, and such that each metal unit of the plurality of metal units overlaps a pixel electrode unit of the plurality of pixel electrode units in a direction perpendicular to surface of the resistive layer.

In one or more embodiments, the method may include the following steps: before the providing the resistive layer, providing a plurality of metal units; providing the resistive layer such that the a plurality of metal units contacts the resistive layer; and forming the plurality of pixel electrode units such that a portion of the resistive layer is disposed between the plurality of metal units and the plurality of pixel electrode units, and such that each metal unit of the plurality of metal units does not substantially overlap any pixel electrode unit of the plurality of pixel electrode units in a direction perpendicular to surface of the resistive layer.

In one or more embodiments, the method may include the following steps: before the providing the resistive layer, providing a plurality of doped silicon units; providing the resistive layer such that the a plurality of doped silicon units contacts the resistive layer; and forming the plurality of pixel electrode units such that a portion of the resistive layer is disposed between the plurality of doped silicon units and the plurality of pixel electrode units, and such that each doped silicon unit of the plurality of doped silicon units overlaps a pixel electrode unit of the plurality of pixel electrode units in a direction perpendicular to surface of the resistive layer.

In one or more embodiments, the method may include the following steps: before the providing the resistive layer, providing a plurality of doped silicon units; providing the resistive layer such that the a plurality of doped silicon units contacts the resistive layer; and forming the plurality of pixel electrode units such that a portion of the resistive layer is disposed between the plurality of doped silicon units and the plurality of pixel electrode units, and such that each doped silicon unit of the plurality of doped silicon units does not substantially overlap any pixel electrode unit of the plurality of pixel electrode units in a direction perpendicular to surface of the resistive layer.

One or more embodiments of the present invention may be related to an organic light-emitting display device that includes the following elements: a substrate; a resistive layer formed on a top portion of the substrate; pixel electrodes formed on the resistive layer and patterned; a light-emitting layer formed on the pixel electrodes; and an opposite electrode disposed opposite to the pixel electrodes with the light-emitting layer interposed therebetween.

In one or more embodiments, the pixel electrodes may be patterned into a plurality of quadrangle patterned pixel electrodes.

In one or more embodiments, the organic light-emitting display device may further include a third insulating layer formed between the patterned pixel electrodes.

In one or more embodiments, the organic light-emitting display device may further include a first metal layer formed on a bottom portion of the resistive layer.

In one or more embodiments, the first metal layer is patterned into separate units.

In one or more embodiments, the first metal layer is patterned into separate units that correspond to the patterned pixel electrodes.

In one or more embodiments, the organic light-emitting display device may further include a doped silicon layer formed on a bottom portion of the resistive layer.

In one or more embodiments, the doped silicon layer is patterned into separate units.

In one or more embodiments, the doped silicon layer is patterned into separate units that correspond to the patterned pixel electrodes.

In one or more embodiments, the resistive layer comprises amorphous silicon, polysilicon, and/or an oxide semiconductor.

In one or more embodiments, the organic light-emitting display device may further include a buffer layer between the substrate and the resistive layer.

One or more embodiments of the present invention may be related to a method for manufacturing an organic light-emitting display device. The method may include the following steps: (a) forming an activation layer on a substrate; (b) forming a first insulating layer on the activation layer; (c) forming a resistive layer on the first insulating layer; (d) sequentially laminating a conductive material and a metal on a result of the (c) process and patterning the conductive material and the metal to simultaneously form pixel electrodes and a gate electrode of a thin film transistor; (e) forming a second insulating layer on a result of the (d) process and patterning the second insulating layer to form openings to expose source and drain regions of the activation layer; (f) patterning the pixel electrodes; and (g) forming a second metal layer on a result of the (f) process and patterning the second metal layer to form source and drain electrodes connected to the source and drain regions.

In one or more embodiments, the method may further include forming a third insulating layer on a result of the (g) process and forming an opening in the third insulating layer to expose the pixel electrodes.

In one or more embodiments, the method may further include forming a light-emitting layer in the opening formed in the third insulating layer and forming an opposite electrode to cover the light-emitting layer.

In one or more embodiments, the method may further include forming a first metal layer on the first insulating layer, wherein the resistive layer is formed on the first metal layer.

In one or more embodiments, the first metal layer is formed as a pattern that includes separate quadrangular units.

In one or more embodiments, the method may further include forming a doped silicon layer on the first insulating layer, wherein the resistive layer is formed on the doped silicon layer.

In one or more embodiments, the doped silicon layer is formed as a pattern that includes separate quadrangular units.

In one or more embodiments, the resistive layer may include amorphous silicon, polysilicon, and/or an oxide semiconductor.

In one or more embodiments, the method may further include forming a buffer layer on the substrate.

BRIEF DESCRIPTION OF THE DRAWINGS

FIGS. 4A to 4F are cross-sectional views illustrating a method for manufacturing an organic light-emitting display device according to an embodiment of the present invention;

DETAILED DESCRIPTION OF EMBODIMENTS OF THE INVENTION

Reference will now be made in detail to embodiments, examples of which are illustrated in the accompanying drawings.

As used herein, the term "and/or" may include any and all combinations of one or more of the associated listed items. Expressions such as "at least one of," when preceding a list of elements, may modify the entire list of elements and may not modify the individual elements of the list.

Although the terms first, second, etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer, or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms first, second, etc. may also be used herein to differentiate different categories of elements. For conciseness, the terms first, second, etc. may represent first-type (or first-category), second-type (or second-category), etc., respectively.

For conciseness, the term "connected" may mean "electrically connected", and the term "insulated" may mean "electrically insulated".

An organic light-emitting display device 1 according to an embodiment of the present invention is described with reference to FIGS. 1 to 3.

Figure 1:
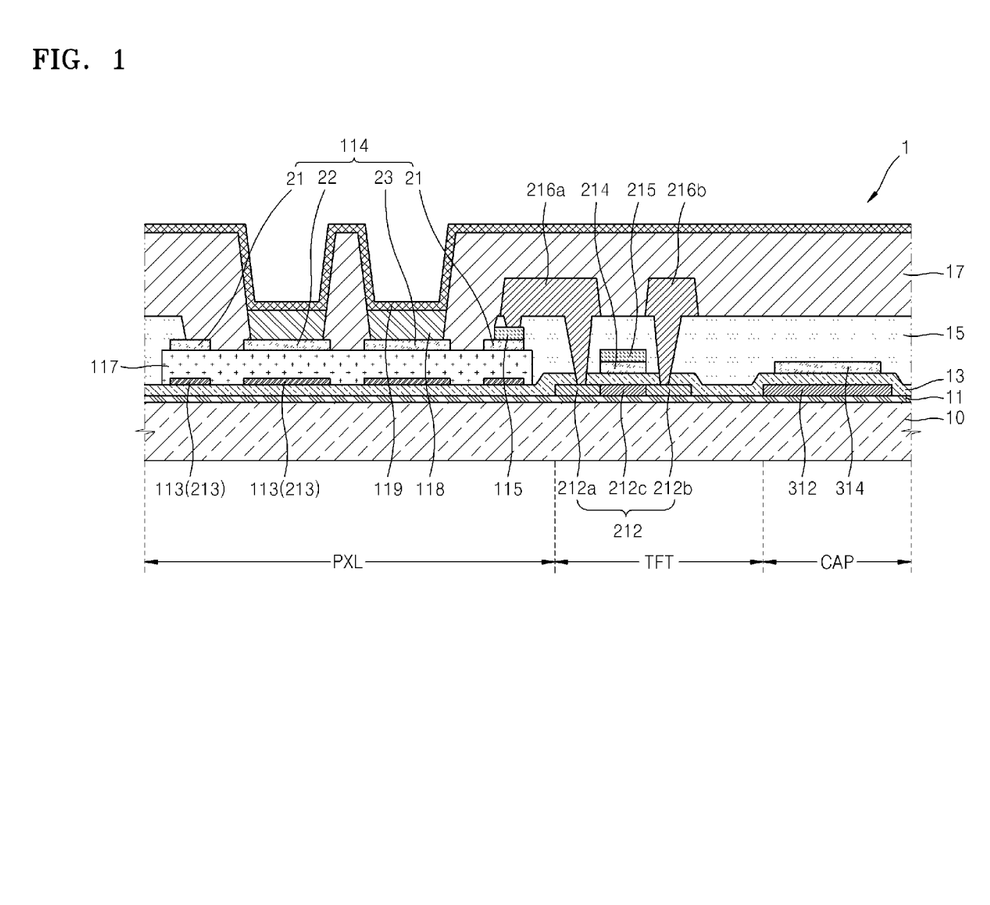
FIG. 1 is a cross-sectional view schematically illustrating an organic light-emitting display device according to an embodiment of the present invention.
Figure 2:
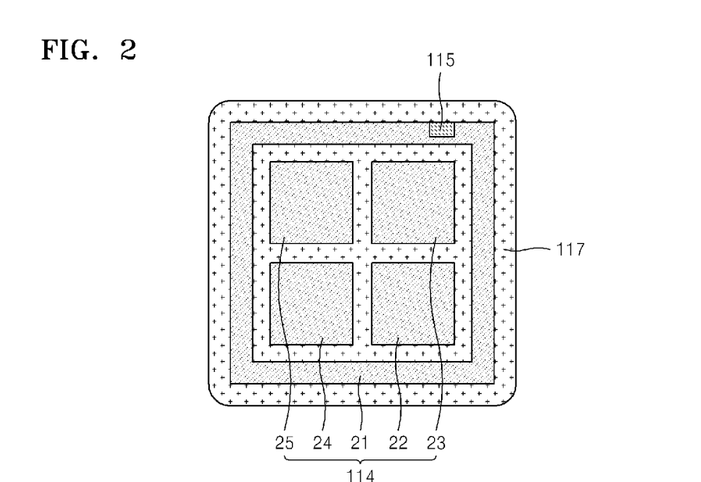
FIG. 2 is a plan view schematically illustrating a resistive layer and a pixel electrode illustrated in FIG. 1.
Figure 3:
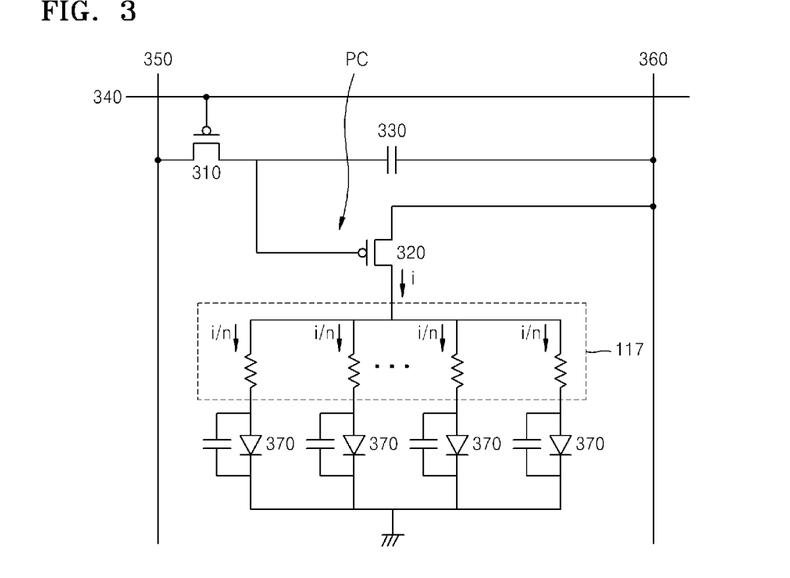
FIG. 3 is a circuit diagram representing a pixel circuit of a single pixel in the organic light-emitting display device illustrated in FIG. 1.

FIG. 1 is a cross-sectional view schematically illustrating the organic light-emitting display device 1, FIG. 2 is a plan view schematically illustrating a resistive layer 117 and a first pixel electrode 114 illustrated in FIG. 1, and FIG. 3 is a circuit diagram representing a pixel circuit PC of a single pixel in the organic light-emitting display device 1 illustrated in FIG. 1.

Referring to FIG.1, the organic light-emitting display device 1 may include a pixel region PXL that has a light-emitting layer 118, a transistor region TFT that has a thin film transistor, and a capacitor region CAP that has a capacitor.

In the transistor region TFT, an activation layer 212 of a thin film transistor is formed on the substrate 10 and a buffer layer 11, wherein the buffer layer 11 may prevent the activation layer 212 from directly contacting the substrate 10. The activation layer 212 may be formed from or formed of a semiconductor material that includes amorphous silicon or polysilicon. The activation layer 212 includes a source region 212a and a drain region 212b, each being doped with ion impurities. The activation layer 212 further includes a channel region 212c disposed between the source region 212a and a drain region 212b.

On the activation layer 212, a first gate electrode 214 and a second gate electrode 215, each including a transparent conductive material, are sequentially formed at a position corresponding to the channel region 212c of the activation layer 212, with a first insulating layer 13 being disposed between the first gate electrode 214 and the channel region 212c and with the first gate electrode 214 being disposed between the first insulating layer 13 and the second gate electrode 215.

A source electrode 216a is electrically connected to the source region 212a of the activation layer 212 and is electrically insulated from the gate electrodes 214 and 215 by a second insulating layer 15. A drain electrode 216b is connected to the drain region 212b of the activation layer 212 and is electrically insulated from the gate electrodes 214 and 215 by the second insulating layer 15. A third insulating layer 17 may overlap the second insulating layer 15 and may cover both the source electrode 216a and the drain electrode 216b.

In the capacitor region CAP, a capacitor bottom electrode 312 formed from or formed of the same material as that of (the channel region 212c of) the activation layer 212 of the thin film transistor, the first insulating layer 13, and a capacitor top electrode 314 formed from or formed of the same material of that of the first pixel electrode 114 are sequentially formed on the substrate 10 and the buffer layer 11. The buffer layer 11 may separate the capacitor bottom electrode 312 from the substrate 10. The first insulating layer 13 may insulate the capacitor bottom electrode 312 from the capacitor top electrode 314.

In the pixel region PXL, the buffer layer 11, the first insulating layer 13, the resistive layer 117, the first pixel electrode 114, and a second pixel electrode 115 are sequentially formed on the substrate 10. The first pixel electrode 114 may be formed from or formed of the same transparent conductive material as that of the first gate electrode 214 and may directly contact the resistive layer 117. The second pixel electrode 115 may be formed from or formed of the same material as that of the second gate electrode 215 and may directly contact an edge portion of the first pixel electrode 114.

In an embodiment, the second pixel electrode 115 may be separated from the first pixel electrode 114.

An opposite electrode 119 (or common electrode 119) may overlap the first pixel electrode 114, and the light-emitting layer 118 is disposed between the first pixel electrode 114 and the opposite electrode 119. The opposite electrode 119 may overlap the substrate 10 in all the pixel region PXL, the transistor region TFT, and the capacitor region CAP.

The light-emitting layer 118 may be formed or formed of a low-molecular organic material or a polymer organic material. In an embodiment, the light-emitting layer 118 is formed from or formed of a low-molecular organic material; a hole transport layer HTL, a hole injection layer HIL, an electron transport layer ETL, and an electron injection layer EIL overlap the light-emitting layer 118. Additional to or alternative to one or more of the layers, one or more other layers may overlap the light-emitting layer 118. In an embodiment, the light-emitting layer 118 may be made of or made from one or more of various organic materials, such as one or more of copper phthalocyanine (CuPc), N,N'-Di(naphthalene-1-yl)-N,N'-diphenyl-benzidine (NPB), and tris-8-hydroxyquinoline aluminum (Alq3).

In an embodiment, the light-emitting layer 118 is made of a polymer organic material, and a hole transport layer HTL may overlap the light-emitting layer 118. The hole transport layer HTL may be made of poly-(2, 4)-ethylene-dihydroxy thiophene (PEDOT) or polyaniline (PANI). In an embodiment, the light-emitting layer 118 may be made of (or made from) one or more of a Poly-Phenylenevinylene-based polymer organic material and a Polyfluorene-based polymer organic material.

The opposite electrode 119 is deposited on the light-emitting layer 118 as a common electrode configured to receive a common voltage or configured to be electrically grounded. In the organic light-emitting display device 1 according to an embodiment, the pixel electrodes 114 and 115 may function as an anode electrode, and the opposite electrode 119 may function as a cathode electrode. In an embodiment, the pixel electrodes 114 and 115 may function as a cathode, and the opposite electrode 119 may function as an anode. In an embodiment, polarities of the electrodes may be reversed.

The opposite electrode 119 may be formed of a reflective material and may function as a reflective electrode. In an embodiment, the opposite electrode 119 may include one or more materials selected from Al, Mg, Li, Ca, LiF/Ca, and LiF/Al.

In an embodiment, the opposite electrode 119 functions as a reflective electrode; a light emitted from the light-emitting layer 118 is reflected by the opposite electrode 119 and is transmitted through the first pixel electrode 114 (which is formed from or formed of a transparent conductive material) towards the substrate 10.

The resistive layer 117 may be formed on (and may directly contact) the first insulating layer 13. A current i (see FIG. 3) incoming through the second pixel electrode 115 may be divided by the resistive layer 117 into divided currents i/n to be transmitted to the patterned first pixel electrode 114. The resistive layer 117 may be formed of a material having electrical resistivity (or electrical resistance). In an embodiment, the resistive layer 117 may be formed of amorphous silicon, polysilicon, or an oxide semiconductor. The resistive layer 117 may be formed of the same type of material used for forming the activation layer 212. Resistance f the resistive layer 117 may be in the range of 0.5 Mohm to 1 Mohm.

A first metal layer 113 may be formed on the first insulating layer 13 at the bottom of the resistive layer 117. The first metal layer 113 may be patterned in correspondence with the patterned first pixel electrode 114, such that portions of the patterned first metal layer 113 respectively correspond to (and overlap) portions of the patterned first pixel electrode 114. The first metal layer 113 formed at the bottom of the resistive layer 117 may substantially improve the uniformity of the resistance of the resistive layer 117; therefore, the light-emitting efficiency of the organic light-emitting display device 1 may be satisfactorily high.

Figure 5:
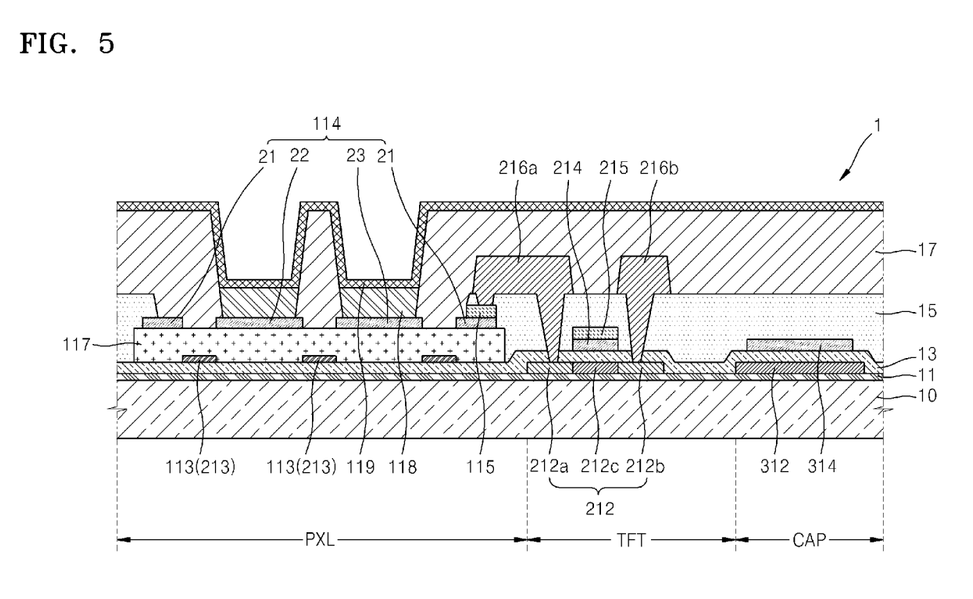
FIG. 5 is a cross-sectional view schematically illustrating an organic light-emitting display device according to an embodiment of the present invention.

In an embodiment, as shown in FIG. 5, the first metal layer 113 may be patterned to be present in a region where the first pixel electrode 114 is not formed, such that portions of the patterned first metal layer 113 may not substantially overlap portions of the first pixel electrode 114 and/or may not substantially overlap the light-emitting layer 118. Bottom emission may be enabled given that the first metal layer 113 is patterned in a region where the first pixel electrode 114 is not formed, wherein the first metal layer 113 may not need to be formed of a transparent material.

Additionally or alternatively, a doped silicon layer 213 may be formed on the first insulating layer 13 at the bottom of the resistive layer 117. The doped silicon layer 213 may be patterned in correspondence with the patterned first pixel electrode 114. The uniformity of the resistance of the resistive layer 117 may be improved by the doped silicon layer 213, which is formed at the bottom of the resistive layer 117. As the resistance of the resistive layer 117 is substantially uniform, the light-emitting efficiency of the organic light-emitting display device 1 may be satisfactory high.

In an embodiment, as shown in FIG. 5, the doped silicon layer 213 may be patterned to be present in a region where the first pixel electrode 114 is not formed, such that portions of the doped silicon layer 213 may not substantially overlap portions of the first pixel electrode 114 and/or may not substantially overlap the light-emitting layer 118.

Referring to FIG. 2, the first pixel electrode 114 may be formed as a pattern that includes a plurality of electrodes on the resistive layer 117. The first pixel electrode 114 may be patterned to include portions or pixel electrode units (or pixel electrodes, for conciseness) in quadrangular forms. The first pixel electrode 114 may include a pixel electrode 21 formed along an outer edge of the first pixel electrode 114. The first pixel electrode 114 may further include a pixel electrode 22, a pixel electrode 23, a pixel electrode 24, and an electrode 25 surrounded by the pixel electrode 21.

The electrode 21 is connected to the second pixel electrode 115 to receive a current i incoming through the second pixel electrode 115 from the transistor region TFT. The electrode 21 may provide the current i to the resistive layer 117. The resistive layer 117 may divide the current i to generate divided currents i/n, wherein n represents the number of pixel electrode units of the first pixel electrode 114 and is an integer greater than 1. A divided current i/n may be provide from the resistive layer 117 to each of the pixel electrode 22, the pixel electrode 23, the pixel electrode 24, and the electrode 25. Shapes and the number of pixel electrode units of the first pixel electrode 114 are not limited to those shown in FIG. 2. In one or more embodiments, the first pixel electrode 114 may include one or more of various numbers of pixel electrode units of one or more of various shapes.

In an embodiment, as shown in FIG. 2, since the number n of pixel electrode units of the first pixel electrode 114 is 4, a current of i/4 may be provided to each of the pixel electrode 22, the pixel electrode 23, the pixel electrode 24, and the electrode 25. Accordingly, the first pixel electrode 114 may be used for emitting 4 light beams.

In one or more embodiments, the first pixel electrode 114 may include n pixel electrode units, such that a single pixel associated with the first pixel electrode 114 may emit light n beams. Accordingly, even if malfunction occurs in some of the n pixel electrode units, the rest of the n pixel electrodes may still function normally for emitting light beams. Advantageously, the pixel may still emit sufficient light for the organic light-emitting display device 1 to display an image with satisfactory quality.

In an embodiment, the organic light-emitting display device 1 includes a plurality of pixels that are arranged in a matrix form. A pixel is a minimum unit for displaying an image, and the organic light-emitting display device 1 may display an image using the plurality of pixels.

A pixel circuit PC associated with a single pixel is described with reference to FIG. 3.

A pixel may include (a portion of) a data line 350, (a portion of) a gate line 340, and (a portion of) a common power line 360 that may provide a driving power voltage for organic light-emitting diodes (OLEDs) 370. A pixel circuit PC may include switching elements that are electrically connected to the data line 350, the gate line 340, and the common power line 360 and are configured to control light emission of the OLEDs 370. Each of the switching elements may include one or more thin film transistors and/or one or more capacitors.

In an embodiment, the pixel circuit includes a switching thin film transistor 310, a driving thin film transistor 320, and a capacitor element 330.

The switching thin film transistor 310 may receive a gate signal from the gate line 340 and may receive a data signal from the data line 350. The switching thin film transistor 310 may be turned on by the gate signal to transfer the data signal to the capacitor element 330 and the driving thin film transistor 320. The driving thin film transistor 320 may include the activation layer 212 and the electrodes 214, 215, 216a, and 216b illustrated in FIG. 1.

In an embodiment, the pixel circuit PC may include a compensation circuit for compensating a voltage value of the driving thin film transistor 320. In an embodiment, the pixel circuit PC may include a compensation circuit for compensating for a voltage drop of the common power line 360.

The driving thin film transistor 320 may control the amount of current flowing into the OLEDs 370 according to the data signal transferred through the switching thin film transistor 310.

The capacitor element 330 may store, for one frame, the data signal transferred through the switching thin film transistor 310.

In an embodiment, the driving thin film transistor 320 and the switching thin film transistor 310 may be PMOS thin film transistors. In an embodiment, at least one of the driving thin film transistor 320 and the switching thin film transistor 310 may be an NMOS thin film transistor. In an embodiment, of the pixel circuit PC may include additional thin film transistors and/or additional capacitor elements.

A current i output from the driving thin film transistor 320 is divided into n divided currents i/n by the resistive layer 117, wherein n is the number of pixel electrode units of the patterned first pixel electrode 114. The n divided currents i/n are input to the patterned OLEDs 370. A current i/n flows into each OLED 370. Accordingly, a single pixel may include n OLEDs 370 configured to emit n light beams. Accordingly, even if malfunction occurs in some of the n OLEDs 370, the other OLEDs 370 may still function normally to emit light. Advantageously, the pixel may still emit sufficient light for the organic light-emitting display device 1 to display an image with satisfactory quality.

Hereinafter, a method for manufacturing the organic light-emitting display device 1 is described with reference to FIGS. 4A to 4H.

Figure 4A:
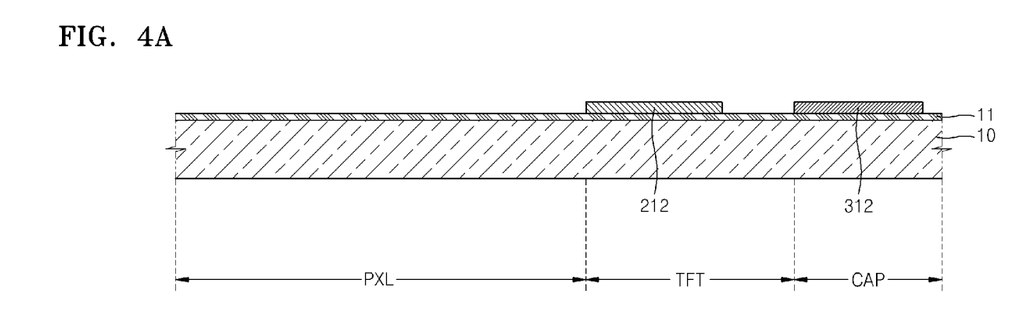
FIG. 4A is a cross-sectional view illustrating a state after an activation layer is formed on a substrate.

FIG. 4A is a cross-sectional view illustrating a state (and a structure) after an activation layer 212 is formed on the substrate 10.

Referring to FIG. 4A, the activation layer 212 of the thin film transistor is formed in the transistor region TFT on the buffer layer 11, which is laminated on the substrate 10. On the buffer layer 11, a capacitor bottom electrode 312 is formed in the capacitor region CAP.

The substrate 10 may be formed from or formed of a transparent glass material, which may have $SiO_2$ as a main component. The buffer layer 11, which may include $SiO_2$ and/or $SiN_x$, may provide a substantially smooth surface on the substrate 10 and may prevent potential permeation of impure elements.

In an embodiment, after a semiconductor layer (not shown) has been deposited on the buffer layer 11 and after a photoresist (not shown) has been disposed on the semiconductor layer, the semiconductor layer is patterned through a photolithography process, which may involve use of a first photo mask (not shown), to simultaneously form the activation layer 212 of the thin film transistor and the capacitor bottom electrode 312.

The photolithography process may include exposing the first photo mask (not shown) using an exposing device (not shown) and one or more of developing, etching, stripping, and ashing.

The semiconductor layer (not shown) may be formed from or formed of amorphous silicon or polysilicon. In an embodiment, the polysilicon may be formed by crystallizing an amorphous silicon. For crystallizing the amorphous silicon, one or more of various methods may be adopted. The method may include a rapid thermal annealing (RTA) method, a solid phase crystallization (SPC) method, an excimer laser annealing (ELA) method, a metal-induced crystallization (MIC) method, a metal-induced lateral crystallization (MILC) method, and a sequential lateral solidification (SLS) method.

Figure 4B:
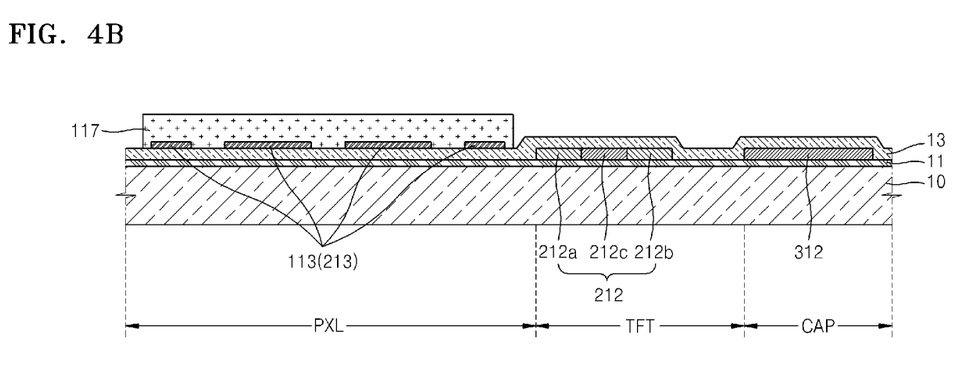
FIG. 4B is a cross-sectional view illustrating a state after a first insulating layer and resistive layer are formed on the substrate.

FIG. 4B is a cross-sectional view illustrating a state (and a structure) after the first insulating layer 13 and the resistive layer 117 are formed on the substrate 10.

Referring to FIG. 4B, the first insulating layer 13 is laminated on the buffer layer 11, the activation layer 212, and the capacitor bottom electrode 312 described with reference to FIG. 4A, and the resistive layer 117 is formed on the first insulating layer 13. The first insulating layer 13 may include a single layer or a plurality of layers, which may be made from or made of one or more of $SiO_2$ and $SiN_x$. The first insulating layer 13 may function as a gate insulating film of the thin film transistor and may function as a dielectric film of the capacitor.

The resistive layer 117 may be formed from or formed of the same type of material as that of the activation layer 212. The resistive layer 117 may be formed through a deposition process that is analogous to the deposition process used for forming the activating layer 212.

Before the resistive layer 117 is formed, the first metal layer 113 may be patterned on the first insulating layer 13. Additionally or alternatively, before the resistive layer 117 is formed, the doped silicon layer 213 may be patterned on the first insulating layer 13.

Figure 4C:
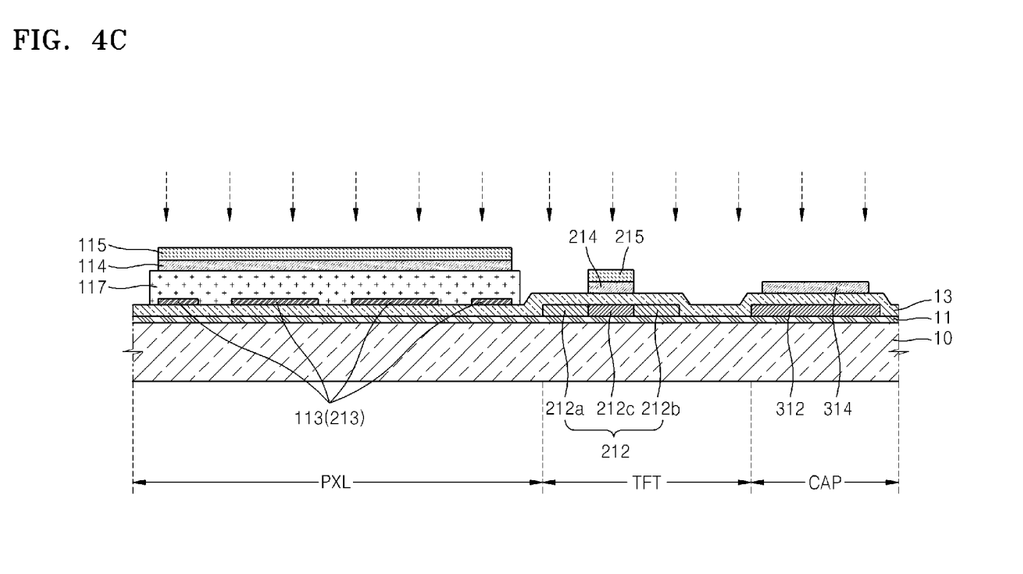
FIG. 4C is a cross-sectional view illustrating a state after a first pixel electrode and a second pixel electrode are form on a structure illustrated in FIG. 4B.

FIG. 4C is a cross-sectional view illustrating a state (and a structure) after the first pixel electrode 114 and the second pixel electrode 115 are formed on the structure illustrated in FIG. 4B.

Referring to FIG. 4C, layers (not shown), including a transparent conductive material and a metal, are sequentially laminated on the structure illustrated in FIG. 4B and are pattered. As a result of the patterning, the first pixel electrode 114, which is formed of the transparent conductive material, and the second pixel electrode 115, which is formed of the metal, are formed in the pixel region PXL on the first insulating layer 13. In the transistor region TFT, the first gate electrode 214, formed of the transparent conductive material, and the second gate electrode 215, formed of the metal, are formed. At the same time, in the capacitor region CAP, the capacitor top electrode 314, formed of the transparent conductive material, is formed. Accordingly, surface shapes of the gate electrodes 214 and 215 may be substantially the same. In addition, surface shapes of the pixel electrodes 114 and 115 may be substantially the same.

The transparent conductive material for forming the first pixel electrode 114, the first gate electrode 214, and the capacitor top electrode 314 may include at least one or more of indium tin oxide (ITO), indium zinc oxide (IZO), zinc oxide (ZnO), indium oxide ($In_2O_3$), indium galium oxide (IGO), and aluminum zinc oxide (AZO).

Each of The second pixel electrode 115 and the second gate electrode 215 may include a single metal layer or a plurality of metal layers and may include one or more of Al, Pt, Pd, Ag, Mg, Au, Ni, Nd, Ir, Cr, Li, Ca, Mo, Ti, W, and Cu.

In an embodiment, in order for the metal to be removed from the top portion of the capacitor top electrode 314, a half-tone mask may be used.

The above-described structure is doped with ion impurities. The ion impurities may be B ions or P ions. The ions may be doped at a density of 1×1015 atoms/cm² or more and may target the capacitor bottom electrode 312 and the activation layer 212.

As a result, the capacitor bottom electrode 312 may have substantially high conductivity so that it forms a high-capacity metal-insulator-metal (MIM) capacitor together with the first insulating layer 13 and the capacitor top electrode 314.

During the doping, the gate electrodes 214 and 215 function as a self-aligned mask to shield the channel region 212c.

As a result, the activation layer 212 may include the doped source region 212a, the doped drain 212b, and the channel region 212c disposed between the doped regions. Using the gate electrodes 214 and 215 as a self-aligned mask may enable formation of the source region 212a and the drain region 212b without use of any additional photo mask.

Figure 4D:
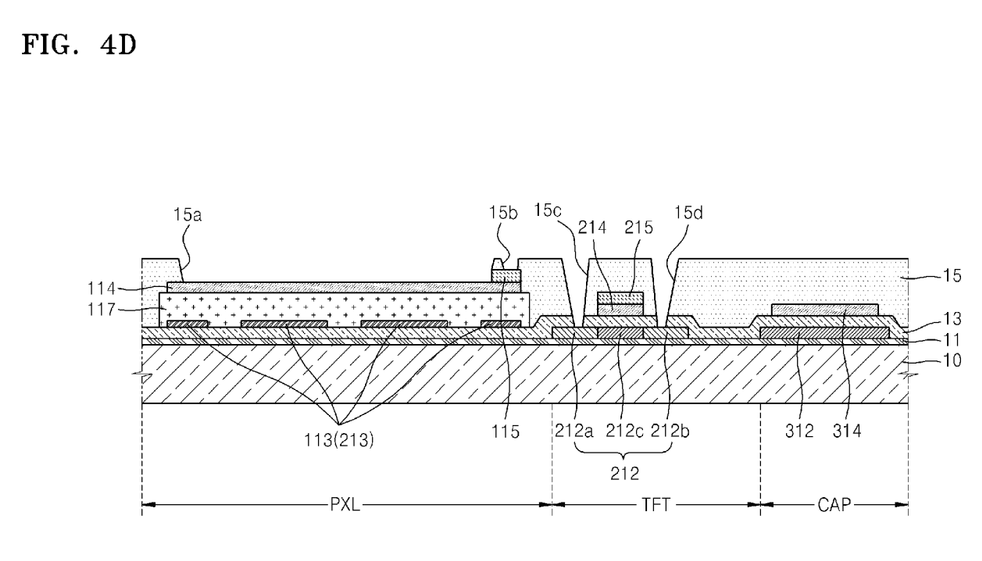
FIG. 4D is a cross-sectional view illustrating a state after a second insulating layer is formed on a structure illustrated in FIG. 4C.

FIG. 4D is a cross-sectional view illustrating a state (and a structure) after the second insulating layer 15 is formed on a structure resulted from processing the structure illustrated in FIG. 4C.

Referring to FIG. 4D, the second insulating layer 15 is laminated on the structure resulted from processing the structure illustrated in FIG. 4C and is patterned to form a first opening 15a for exposing the first pixel electrode 114, a second opening 15b for exposing the remaining second pixel electrode 115 (wherein a portion of the second pixel electrode 115 has been etched to expose a substantial portion of the first pixel electrode 114), a third opening 15c for exposing the source region 212a of the activation layer 212, and the fourth opening 15d for exposing the drain region 212b.

In an embodiment, after the second insulating layer 15 is patterned to form the openings 15a, 15b, 15c, and 15d, a portion of the second pixel electrode 115 that is exposed by the first opening 15a is further removed. Without an additional masking process, the removal of the portion of the second pixel electrode 115 may include injecting an etchant, which etches away the portion of the second pixel electrode 115 (which is made of a metal).

In an embodiment, a portion of the second pixel electrode 114 may be removed in the above-described metal removal process that involves the use of the half-tone mask.

Figure 4E:
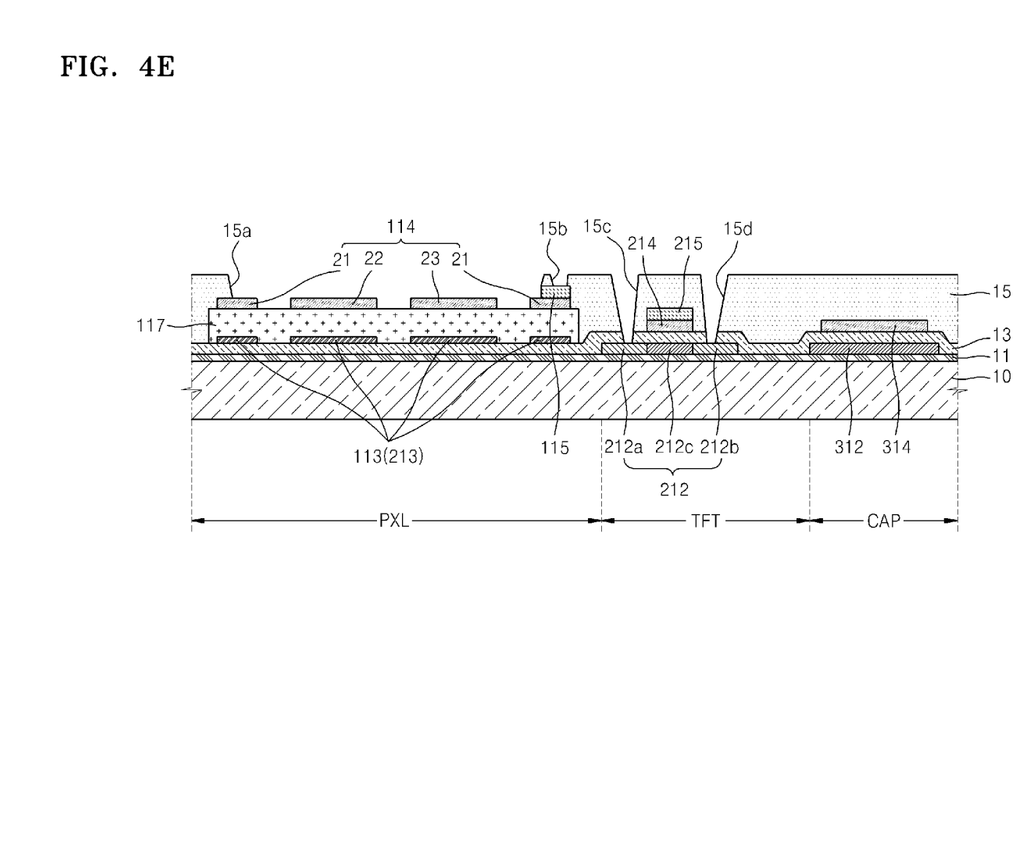
FIG. 4E is a cross-sectional view illustrating a state after the first pixel electrode is patterned.

FIG. 4E is a cross-sectional view illustrating a state (and a structure) after the first pixel electrode 114 is patterned.

Referring to the FIG. 4E, the first pixel electrode 114 may be patterned. The first pixel electrode 114 may be patterned to include portions (or pixel electrode units) that correspond to portions of the first metal layer 113 and/or portions of the doped silicon layer 213 disposed at the bottom of the resistive layer 117. In an embodiment, the pixel electrode units of the first pixel electrode 114 may have quadrangular shapes, as illustrated in FIG. 2.

In an embodiment, as shown on FIG. 5, the first pixel electrode 114 may be include portions (or pixel electrode units) that do not substantially overlap (in a direction perpendicular to the bottom surface of the substrate 10) portions of the first metal layer 113 and/or the doped silicon layer 213 disposed at the bottom of the resistive layer 117. Accordingly, the organic light-emitting display device 1 may perform bottom emission.

Figure 4F:
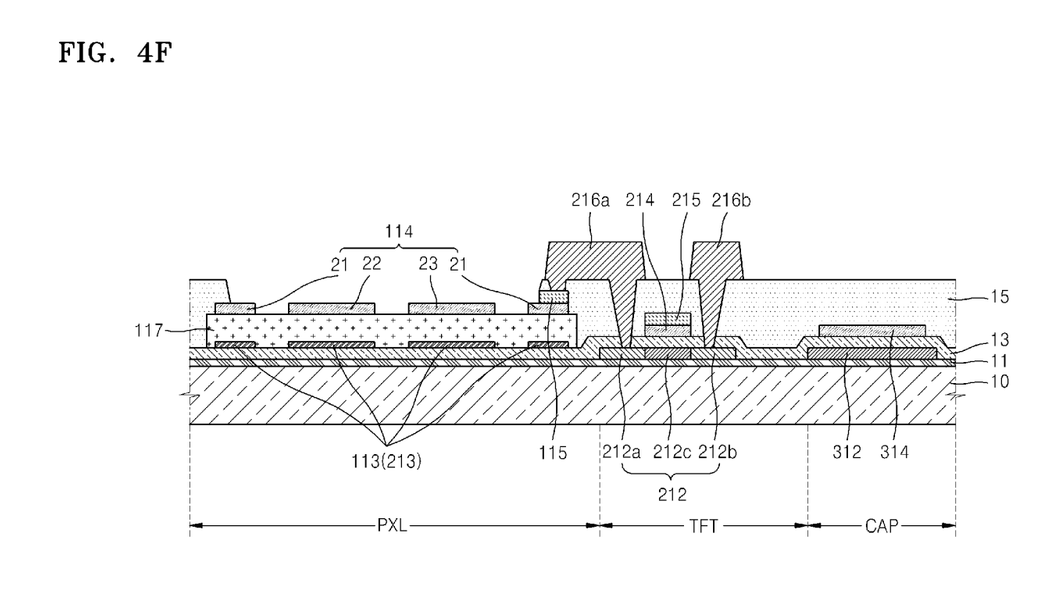
FIG. 4F is a cross-sectional view illustrating a state after source and drain electrodes are formed on a structure illustrated in FIG. 4E.

FIG. 4F is a cross-sectional view illustrating a state (and a structure) after the source electrode 216a and the drain electrode 216b are formed on the structure illustrated in FIG. 4E.

Referring to FIG. 4F, the source electrode 216a and the drain electrode 216b are formed on the second insulating layer 15 to fill the openings 15b, 15c, and 15d formed in the second insulating layer 15, wherein the opening 15c and 15d are formed in the transistor region TFT.

Each of the electrodes 216a and 216b may include a single layer or a plurality of layers of one or more metals, such as one or more of Al, Pt, Pd, Ag, Mg, Au, Ni, Nd, Ir, Cr, Li, Ca, Mo, Ti, W, and Cu.

Figure 4G:
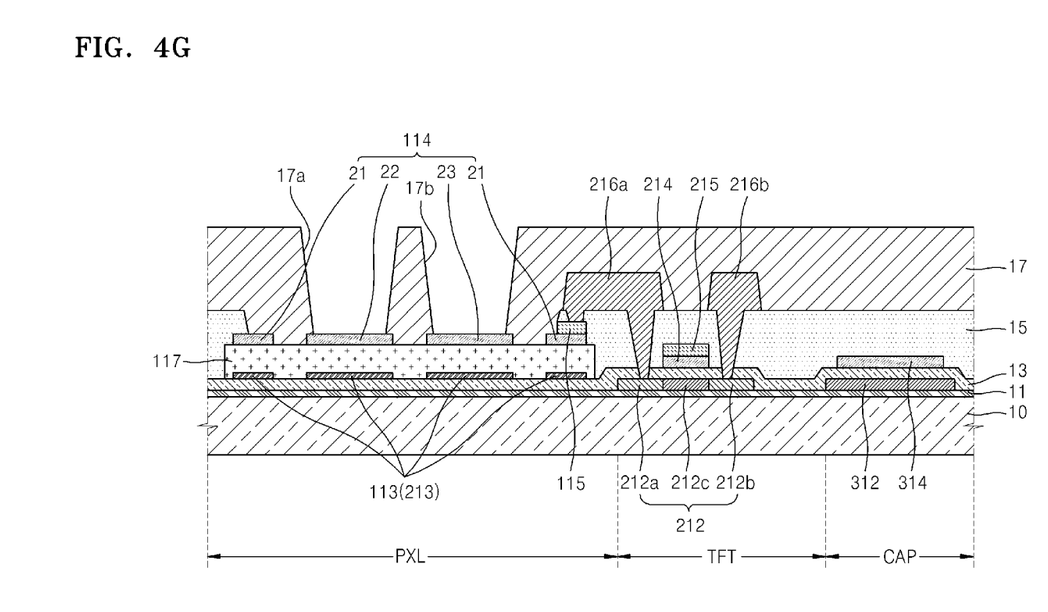
FIG. 4G is a cross-sectional view illustrating a state after a third insulating layer is formed on a structure illustrated in FIG. 4F.

FIG. 4G is a cross-sectional view illustrating a state (and a structure) after the third insulating layer 17 is formed on the structure illustrated in FIG. 4F.

Referring to FIG. 4G, the third insulating layer 17 is laminated on the structure illustrated in FIG. 4F and is patterned to form openings 17a and 17b, which expose a top portion of the first pixel electrode 114.

Besides defining light-emitting regions, the openings 17a and 17b may prevent short circuiting between the pixel electrodes 114 and 115 and the opposite electrode 119 by widening an interval between edges of the pixel electrodes 114 and 115 and the opposite electrode 119 (see FIG. 1) to prevent an electric field from being substantially focused on the edges of the pixel electrodes 114 and 115. The third insulating layer 17 may be an organic insulating film or an inorganic insulating film.

Figure 4H:
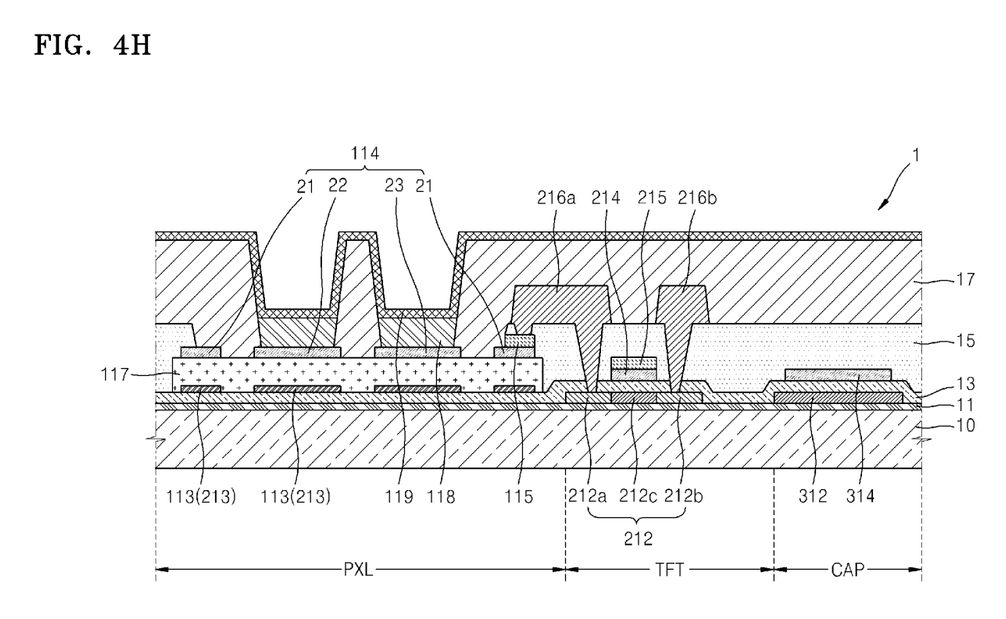
FIG. 4H is a cross-sectional view illustrating a state after a light-emitting layer and opposite electrode are formed on a structure illustrated in FIG. 4F.

FIG. 4H is a cross-sectional view illustrating a state (and a structure) after the light-emitting layer 118 and the opposite layer 119 are formed on the structure illustrated in FIG. 4F.

Referring to FIG. 4H and FIG. 1, the organic light-emitting display device 1 may be formed after the light-emitting layer 118 and the opposite layer 119 has been formed on the structure illustrated in FIG. 4F. Since a single pixel includes a plurality of OLEDs (associated with a plurality of pixel electrode units) to emit light beams, even if malfunction occurs in some of the OLEDs, sufficient light beams may still be emitted from the rest of the OLEDs. Advantageously, satisfactory image quality may be provided, and a satisfactory panel yield can be attained.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A display device comprising:
   a power line configured to transmit an electric current;
   a plurality of pixel electrode units associated with a single pixel of the display device and configured to share the electric current;
   a resistive layer that is configured to divide the electric current to generate a plurality of divided currents and is configured to provide a divided current of the plurality of divided currents to each pixel electrode unit of the plurality of pixel electrode units;
   a common electrode overlapping the plurality of pixel electrode units; and
   a plurality of light-emitting units associated with the single pixel of the display device and disposed between the common electrode and the plurality of pixel electrode units, wherein each light-emitting unit of the plurality of light-emitting units overlaps a pixel electrode unit of the plurality of pixel electrode units,
   wherein the plurality of pixel electrode units and the resistive layer are connected with a same driving thin film transistor.

2. The display device of claim 1, wherein the resistive layer contacts the plurality of pixel electrode units.

3. The display device of claim 1, wherein the resistive layer includes at least one of amorphous silicon, polysilicon, and an oxide semiconductor.

4. The display device of claim 1, further comprising a plurality of metal units that contacts the resistive layer, wherein a portion of the resistive layer is disposed between the plurality of metal units and the plurality of pixel electrode units, and wherein each metal unit of the plurality of metal units overlaps a pixel electrode unit of the plurality of pixel electrode units in a direction perpendicular to surface of the resistive layer.

5. The display device of claim 1, further comprising a plurality of metal units that contacts the resistive layer, wherein a portion of the resistive layer is disposed between the plurality of metal units and the plurality of pixel electrode units, and wherein each metal unit of the plurality of metal units does not substantially overlap any pixel electrode unit of the plurality of pixel electrode units in a direction perpendicular to surface of the resistive layer.

6. The display device of claim 1, further comprising a plurality of doped silicon units that contacts the resistive layer, wherein a portion of the resistive layer is disposed between the plurality of doped silicon units and the plurality of pixel electrode units, and wherein each doped silicon unit of the plurality of doped silicon units overlaps a pixel electrode unit of the plurality of pixel electrode units in a direction perpendicular to surface of the resistive layer.

7. The display device of claim 1, further comprising a plurality of doped silicon units that contacts the resistive layer, wherein a portion of the resistive layer is disposed between the plurality of doped silicon units and the plurality of pixel electrode units, and wherein each doped silicon unit of the plurality of doped silicon units does not substantially overlap any pixel electrode unit of the plurality of pixel electrode units in a direction perpendicular to surface of the resistive layer.

8. The display device of claim 1, further comprising:
   a substrate overlapping the common electrode, wherein the resistive layer is disposed between the substrate and the common electrode; and
   a buffer layer disposed between the substrate and the resistive layer.

9. A display device comprising:
   a power line configured to transmit an electric current;
   a plurality of pixel electrode units associated with a single pixel of the display device and configured to share the electric current;
   a common electrode overlapping the plurality of pixel electrode units;
   a plurality of light-emitting units associated with the single pixel of the display device and disposed between the common electrode and the plurality of pixel electrode units, wherein each light-emitting unit of the plurality of light-emitting units overlaps a pixel electrode unit of the plurality of pixel electrode units; and
   a first current-receiving electrode that is electrically connected to the power line and surrounds the plurality of pixel electrode units,
   wherein the plurality of pixel electrode units and the resistive layer are connected with a same driving thin film transistor.

10. The display device of claim 9, further comprising a resistive layer that contacts the first current-receiving electrode for receiving the electric current from the first current-receiving electrode, contacts the plurality of pixel electrode units, is configured to divide the electric current to generate a plurality of divided currents, and is configured to provide a divided current of the plurality of divided currents to each pixel electrode unit of the plurality of pixel electrode units.

11. The display device of claim 10, further comprising:
   a switching element electrically connected to the power line for receiving the electric current; and
   a second current-receiving electrode disposed between the first current-receiving electrode and an electrode of the switching element for transmitting the electric current from the switching element to the first current-receiving electrode, wherein the first current-receiving electrode is formed of a first material, and wherein the second current-receiving electrode is formed of a second material that is different from the first material.

12. The display device of claim 1, wherein each pixel electrode unit of the plurality of pixel electrode units has a quadrangular shape in a plan view of the display device.

13. A display device comprising:
    a power line configured to transmit an electric current;
    a plurality of pixel electrode units associated with a single pixel of the display device and configured to share the electric current;
    a common electrode overlapping the plurality of pixel electrode units;
    a plurality of light-emitting units associated with the single pixel of the display device and disposed between the common electrode and the plurality of pixel electrode units, wherein each light-emitting unit of the plurality of light-emitting units overlaps a pixel electrode unit of the plurality of pixel electrode units; and
    an insulator that overlaps and directly contacts the common electrode, electrically insulates the pixel electrode units from each other, and electrically insulates the light-emitting units from each other.

14. The display device of claim 13, further comprising: a resistive layer that is configured to divide the electric current to generate a plurality of divided currents and is configured to provide a divided current of the plurality of divided currents to each pixel electrode unit of the plurality of pixel electrode units,
    wherein a first portion of the common electrode contacts a light-emitting unit of the plurality of light-emitting units,
    wherein a second portion of the common electrode contacts the insulator without contacting any light-emitting unit of the plurality of light-emitting units, and
    wherein a distance between the first portion of the common electrode and the resistive layer is smaller than a distance between the second portion of the common electrode and the resistive layer.

* * * * *